US011543462B2

(12) United States Patent
Shi et al.

(10) Patent No.: US 11,543,462 B2
(45) Date of Patent: Jan. 3, 2023

(54) SINGLE-PHASE-TO-GROUND FAULT LINE SELECTION METHOD FOR DISTRIBUTION LINES AND COMPUTER READABLE STORAGE MEDIUM

(71) Applicant: TSINGHUA UNIVERSITY, Beijing (CN)

(72) Inventors: Shenxing Shi, Beijing (CN); Qilong Qian, Beijing (CN); Xinzhou Dong, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 369 days.

(21) Appl. No.: 16/693,675

(22) Filed: Nov. 25, 2019

(65) Prior Publication Data
US 2021/0156928 A1      May 27, 2021

(30) Foreign Application Priority Data
Nov. 23, 2019   (CN) .......................... 201911160418.8

(51) Int. Cl.
*G01R 31/52*     (2020.01)
*G01R 19/00*     (2006.01)
*G01R 19/25*     (2006.01)

(52) U.S. Cl.
CPC ......... *G01R 31/52* (2020.01); *G01R 19/0038* (2013.01); *G01R 19/2513* (2013.01)

(58) Field of Classification Search
CPC .... G01R 31/52; G01R 31/085; G01R 31/088; G01R 31/11; G01R 19/0038; G01R 19/2513; G01R 19/04; H02H 3/165
See application file for complete search history.

(56) References Cited

U.S. PATENT DOCUMENTS

2010/0103577 A1\*   4/2010   Shin .......................... H02H 3/00
                                                                  361/84
2013/0015878 A1    1/2013   Perera et al.
(Continued)

FOREIGN PATENT DOCUMENTS

CN      1645704 A      7/2005
CN      1673764 A      9/2005
(Continued)

OTHER PUBLICATIONS

Examination Report No. 1 dated Jun. 29, 2020 received in Australian Patent Application No. 2019271889.
(Continued)

*Primary Examiner* — Son T Le
*Assistant Examiner* — Lal C Mang
(74) *Attorney, Agent, or Firm* — Scully Scott Murphy & Presser

(57) ABSTRACT

The present invention discloses A method of single-phase-to-ground fault line selection for a distribution line based on the comparison of phase current traveling waves, comprising: sampling three phases current traveling waves on the distribution line, and taking the busbar pointing to the line as the current positive direction; when a single-phase-to-ground fault occurs on the distribution lines, comparing the amplitude and polarity of the difference between the three phases current traveling waves before and after the fault, wherein when the amplitude of one of the three phases current traveling wave is higher than 1.5 times of the amplitude of the other two phases current traveling waves, and the polarity of the one of three phases current traveling wave of the largest amplitude is opposite to the polarity of the other two phases current traveling waves, it is determined that the fault occurs on the load side of the measuring point of the line, and the phase with the largest amplitude of (Continued)

the current traveling wave is the fault phase; if the difference of the amplitudes of the three phases current traveling waves is within a predetermined value and the polarity is the same, it is determined that the fault occurs on the power source side of the measuring point of the line. By the technical solution of The present invention, the precise line selection of the single-phase ground fault of the distribution line can be realized.

5 Claims, 6 Drawing Sheets

(56) References Cited

U.S. PATENT DOCUMENTS

| | | |
|---|---|---|
| 2018/0203056 A1 | 7/2018 | Dzienis et al. |
| 2018/0364293 A1 | 12/2018 | Li et al. |

FOREIGN PATENT DOCUMENTS

| | | | | |
|---|---|---|---|---|
| CN | 101154806 A | | 4/2008 | |
| CN | 101551433 A | | 10/2009 | |
| CN | 201532430 U | | 7/2010 | |
| CN | 101923137 A | | 12/2010 | |
| CN | 102185290 A | | 9/2011 | |
| CN | 102420420 A | | 4/2012 | |
| CN | 202975238 U | | 6/2013 | |
| CN | 104360226 A | | 2/2015 | |
| CN | 104483594 A | | 4/2015 | |
| CN | 105203923 A | | 12/2015 | |
| CN | 105244861 A | | 1/2016 | |
| CN | 105403807 A | | 3/2016 | |
| CN | 105548806 A | | 5/2016 | |
| CN | 106646139 A | * | 5/2017 | ........... G01R 31/086 |
| CN | 106646139 A | | 5/2017 | |
| CN | 106841913 A | | 6/2017 | |
| CN | 106997016 A | * | 8/2017 | ........... G01R 31/085 |
| CN | 107219440 A | | 9/2017 | |
| CN | 108306263 A | | 7/2018 | |
| CN | 108336720 A | * | 7/2018 | ............ G01R 31/50 |
| CN | 109301800 A | | 2/2019 | |
| CN | 109301800 A | * | 2/2019 | ........... G01R 31/085 |
| CN | 110456226 A | | 11/2019 | |
| EP | 3 351 949 A1 | | 7/2018 | |
| EP | 3 531 524 A1 | | 8/2019 | |
| JP | H05-34397 A | | 2/1993 | |
| WO | 2015/118163 A1 | | 8/2015 | |

OTHER PUBLICATIONS

First Office Action dated Jul. 29, 2020 received in Chinese Patent Application No. 201911160418.8 together with an English language translation.

Duan, J. et al., "Research of Traveling-wave Differential Bus Protection Based on Wavelet Transform", IEEE/PES Transmission and Distribution Conference and Exhibition: Asia and Pacific, 2005, pp. 1-4.

Notification of Reasons for Refusal dated Jan. 12, 2021 received in Japanese Patent Application No. 2019-212217 together with an English language translation.

Notification of Reasons for Refusal dated Jan. 21, 2021 received in Korean Patent Application No. 10-2019-0152624 together with an English language translation.

Lei, A. et al., "A Novel Current Travelling Wave Based Single-ended Fault Location Method for Locating Single-phase-to-ground Fault of Transmission line", 2015 50th International Universities Power Engineering Conference (UPEC), Sep. 2015, pp. 1-6.

Jiang, B. et al., "A Method of Single Phase to Ground Fault Feeder Selection Based on Single Phase Current Traveling Wave for Distribution Lines", Proceedings of the CSEE, Dec. 5, 2014, pp. 6216-6227, vol. 34, No. 34.

He, X. et al., "Adaptive traveling waves based protection of distribution lines", 2nd IEEE Conference on Energy Internet and Energy System Integration (EI2), 2018, pp. 1-5.

* cited by examiner

SINGLE-PHASE-TO-GROUND FAULT LINE SELECTION METHOD FOR DISTRIBUTION LINES AND COMPUTER READABLE STORAGE MEDIUM

PRIORITY CLAIM AND RELATED APPLICATION

The present application claims the priority of Chinese Application No. 201911160418.8, filed in the Chinese Patent Office on Nov. 23, 2019, and entitled "Single-phase-to-ground fault line selection method for distribution lines and computer-readable storage medium", the entirety of which is herein incorporated by reference.

TECHNICAL FIELD

The present invention relates to the field of power system protection and control technologies, and in particular, to a single-phase-to-ground fault line selection method for a power distribution line.

BACKGROUND

Single-phase-to-ground faults are the main type of fault in distribution networks, accounting for more than 80%. In order to improve the reliability of the power supply, the neutral point of the power distribution system is usually grounded non-effectively. Industry standards stipulate that after a single-phase-to-ground fault occurs, it is allowed to operate for 2 hours. However, after a single-phase-to-ground fault occurs, a large capacitive current flows through the ground. In general, when the grounding capacitive current exceeds 30A, in order to avoid arc reignition and arc overvoltage, the arc suppression coil is often used to compensate the capacitor current. The method of using the arc suppression coil to compensate the capacitive current can be divided into three types: full compensation, over compensation and under compensation. In general, the overcompensation method is adopted the most in order to avoid the resonance phenomenon caused by the change of the operation mode or the partial load exiting the operation. The application of arc suppression coils greatly reduces the current characteristics of single-phase-to-ground faults, which poses a huge challenge to fault detection.

In the 1980s, the single-phase ground fault line selection technology was proposed. The steady-state method, transient method, traveling wave method and signal injection method are the main fault line selection methods.

The steady-state method and the transient method refer to the selection of the fault line by using the steady-state characteristics and transient characteristics of different feeders after the single-phase-to-ground fault occurs. The steady state method includes a group ratio phase ratio phase method, a zero sequence admittance method, and the like. The transient method includes the first half wave method, the transient characteristic band method, and the like. However, due to the influence of the arc suppression coil and complex operating conditions, the steady state method and the transient method are difficult to meet the site requirements.

The signal injection method artificially injects signals at the distribution busbar, and analyzes the influence of the signal on the fault line and the non-fault line, and uses the method of detecting the change of the signal of different lines to select the line. This method needs to change the primary side equipment or operate the primary side equipment, which may affect the safe operation of the power system.

The traveling wave line selection method is a method of selecting a ground line by using a traveling wave generated by a single-phase ground fault. The method compares the amplitude and polarity of the initial current traveling wave on different lines to select the fault line.

The existing steady-state, transient and traveling wave line selection methods need to connect current transformers of all lines, so they are all affected by the characteristics of different line current transformers.

In addition, branch lines are an important topological feature of power distribution systems. Due to the rapid urbanization process, the planning of distribution lines is difficult to synchronize with the urban construction planning, resulting in the application of branch lines in order to meet the urban power supply requirements. In some cities, the length of the branch line accounts for a higher proportion of the total length of the 10 kV distribution line. At present, all single-phase-to-ground fault line selection strategies cannot select branch lines.

SUMMARY

The present invention aims to solve at least one of the technical problems existing in the prior art or related art.

The present invention provides a method of single-phase-to-ground fault line selection for a distribution line based on the comparison of phase current traveling waves, comprising: sampling three phases current traveling waves on the distribution line, and taking the bus bar to the line as the current positive direction; when a single-phase-to-ground fault occurs on the distribution lines, comparing the amplitude and polarity of the difference between the three phases current traveling waves before and after the fault, wherein when the amplitude of one of the three phases current traveling wave is higher than 1.5 times of the amplitude of the other two phases current traveling waves, and the polarity of the one of three phases current traveling wave of the largest amplitude is opposite to the polarity of the other two phases current traveling waves, it is determined that the fault occurs on the load side of the measuring point of the line, and the phase with the largest amplitude of the current traveling wave is the fault phase; if the difference of the amplitudes of the three phases current traveling waves is within a predetermined value and the polarity is the same, it is determined that the fault occurs on the power source side of the measuring point of the line.

When the three-phase system is operating normally, the three-phase line has a capacitance to ground and a capacitance between the phases and phases. When a single-phase-to-ground fault occurs in a three-phase system, the voltage of the ground phase decreases, and the voltage of the ungrounded phase increases. The line voltage between the phase and the phase, whether it is between the grounded phase and the ungrounded phase, or it is between the ungrounded phases, is unchanged. Therefore, the electrical quantity on the capacitance between the phase and phase of the three-phase line is not affected by the single-phase-to-ground fault, but the electrical quantity on the capacitance between the phase and ground is significantly affected by the single-phase-to-ground fault. The specific analysis is as follows.

Since the voltage of the ungrounded phase rises from the phase voltage to the line voltage, whether it is a grounded or ungrounded line, the capacitance between the non-grounded phase line and ground will be charged. Since the voltage of the ground phase decreases, especially the voltage at the grounding point is reduced from the phase voltage to the ground voltage (a reference value of zero voltage), the capacitance between the ground phase line and ground will discharge to the grounding point. On the power supply side, the discharge direction of the capacitor is the direction of the power supply pointing to the grounding point, that is, the direction of the busbar pointing to the line; and on the load side of the grounding point of the grounding line, the discharge direction of the capacitor is the direction of the load pointing to the grounding point, that is, the direction of the line to the busbar. For a non-grounded line, the discharge direction of the capacitor in the ground phase is the line pointing to the busbar. Therefore, after the single-phase ground fault occurs, at the power supply side of the grounding point of the grounding line, the grounding phase current and the non-grounding phase current flow direction are opposite; at the load side of the grounding point of the grounding line, the grounding phase current and the non-grounding phase current flow direction are the same. For non-grounded circuits, the current in the ground phase is the same as the current in the ungrounded phase current.

Traveling waves are essentially electromagnetic waves propagating in conductors, including transient traveling waves and steady-state traveling waves. When a single-phase ground fault occurs in the power system, according to the superposition principle, the network after the fault can be decomposed into a superposition of the load network and the fault component network. Obviously, the single-phase-to-ground fault current traveling wave fault component is only related to the fault component network. Therefore, the phase current fault component can reflect the ground line and ground point location.

Based on the above principle, a single-phase-to-ground fault line selection method for distribution lines based on phase-current traveling wave comparison is provided.

According to some embodiment of the present invention, the measuring point is at outfeeding terminal of the distribution line in a substation. In this situation, the three phase current traveling waves collected at this time is a three phase current traveling waves of all the outfeeding lines on all the bus bars. Similarly, the single-phase-to-ground fault line selection can be realized by comparing the difference between the three phase current traveling waves before and after the fault of all outfeeding lines.

According to some embodiment of the present invention, the measuring point is at outfeeding terminal of branch line in a power distribution line. In this situation, the three phase current traveling waves collected at this time is a three phase current traveling waves of all the outfeeding terminal of branch line. Similarly, the single-phase-to-ground fault line selection can be realized by comparing the difference between the three phase current traveling waves before and after the fault of all branch lines.

According to some embodiment of the present invention, further comprising: sampling and storing the steady-state three phases current traveling waves under normal operation of the distribution line in real time.

According to some embodiment of the present invention, comparing the amplitude and polarity of the difference between the three phases current traveling waves before and after the fault comprising: comparing the amplitude and polarity of the difference between the three phases current traveling waves before and after the fault comprising: sampling three phases current traveling waves at the measuring point in real time after a single-phase-to-ground occurs, subtracting three phases current travelling waves under normal operation from three phases current travelling waves after a fault to get three phases current travelling waves difference, comparing the amplitude and polarity of three phases current traveling wave difference.

The mathematical representation of the three phases current traveling wave difference is three sinusoidal signal. The magnitude and polarity of the three-phase current traveling wave difference can be obtained by mathematical decomposition.

According to some embodiment of the present invention, further comprising: sampling three phases current traveling waves at the measuring point in real time; subtracting three phases current travelling waves one power frequency cycle ago from three phases current travelling waves now to get three phases current travelling waves difference, and comparing three phases current travelling waves difference with the setting threshold, if any one phase current traveling wave is higher than the setting threshold, starting the fault line selection.

By setting the preset threshold as the criterion for starting the ground line, it can be considered that no ground fault has occurred before the threshold is reached, so the frequently starting judgment of the ground fault is avoided. The threshold can be a value that avoids the maximum interference in the system, such as 100 mA (milliamps).

The present invention also provides a computer-readable storage medium, on which a computer program is stored, which is characterized in that, when the computer program is executed, the step of realizing the method of single-phase ground fault line selection for distribution lines as described in any one of technical solutions described above is realized.

Additional aspects and advantages of the present invention will be given in the following description, some of which will be apparent from the following description or be appreciated from practices of the present invention.

BRIEF DESCRIPTION OF THE DRAWINGS

The above and/or additional aspects and advantages of the present invention will be apparent and easily understood in the description of embodiments with reference to the following drawings, where.

DETAILED DESCRIPTION OF EMBODIMENTS

The present invention will be further described in detail below with reference to the drawings and specific embodiments. It should be noted that the embodiments in the present application and the features in the embodiments may be combined with each other without conflict.

Numerous specific details are set forth in the description below in order to provide a thorough understanding of the present invention. However, the present invention may be embodied in other specific ways than those described herein. Therefore, the scope of the present invention is not limited by the specific embodiments disclosed below.

Figure 1:
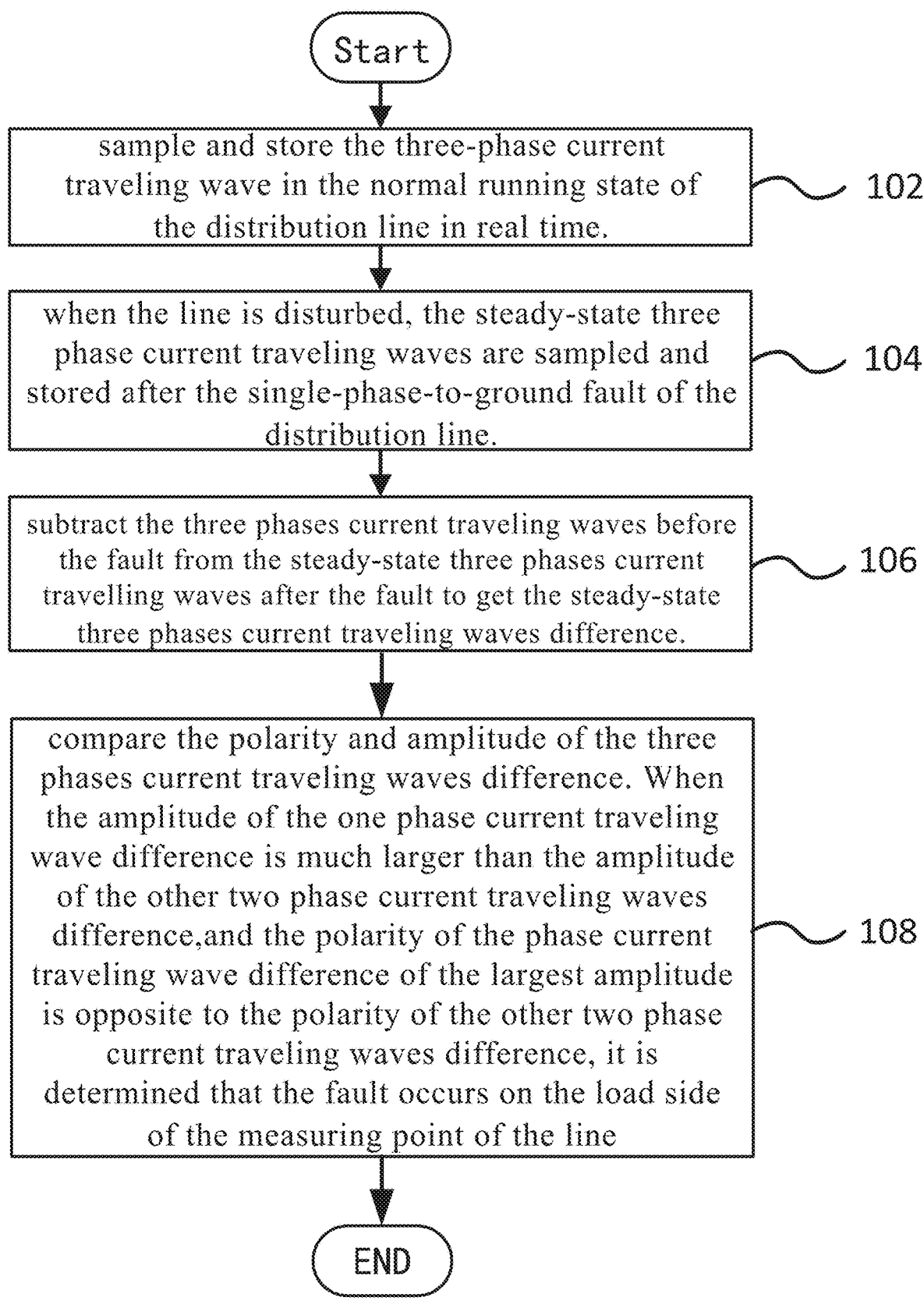
FIG. 1 is a flow chart showing a single-phase-to-ground line selection method for a distribution line based on phase current traveling waves comparison according to one embodiment of the present invention.

FIG. 1 is a flow chart showing a single-phase grounding line selection method for a distribution line based on phase current traveling wave comparison according to the first example of the present invention. Wherein the method comprises:

Step 102, sample and store the three-phase current traveling wave in the normal running state of the distribution line in real time.

Step 104, when the line is disturbed, the steady-state three phase current traveling waves are sampled and stored after the single-phase-to-ground fault of the distribution line.

Step 106, subtract the three phases current traveling waves before the fault from the steady-state three phases current travelling waves after the fault to get the steady-state three phases current traveling waves difference.

Figure 6:
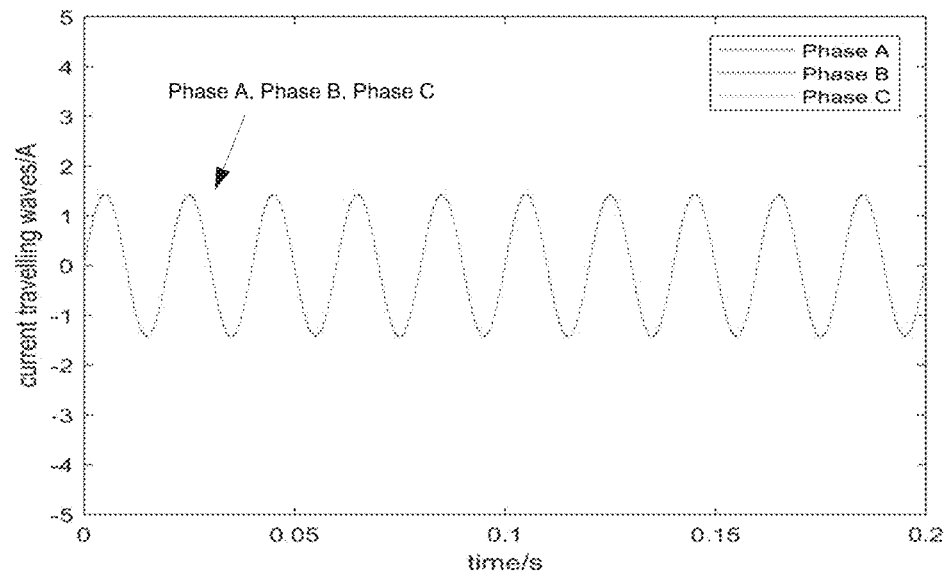
FIG. 6 is a simulation waveform diagram of a fault point on the load side of the measuring point according to the present invention.
Figure 7:
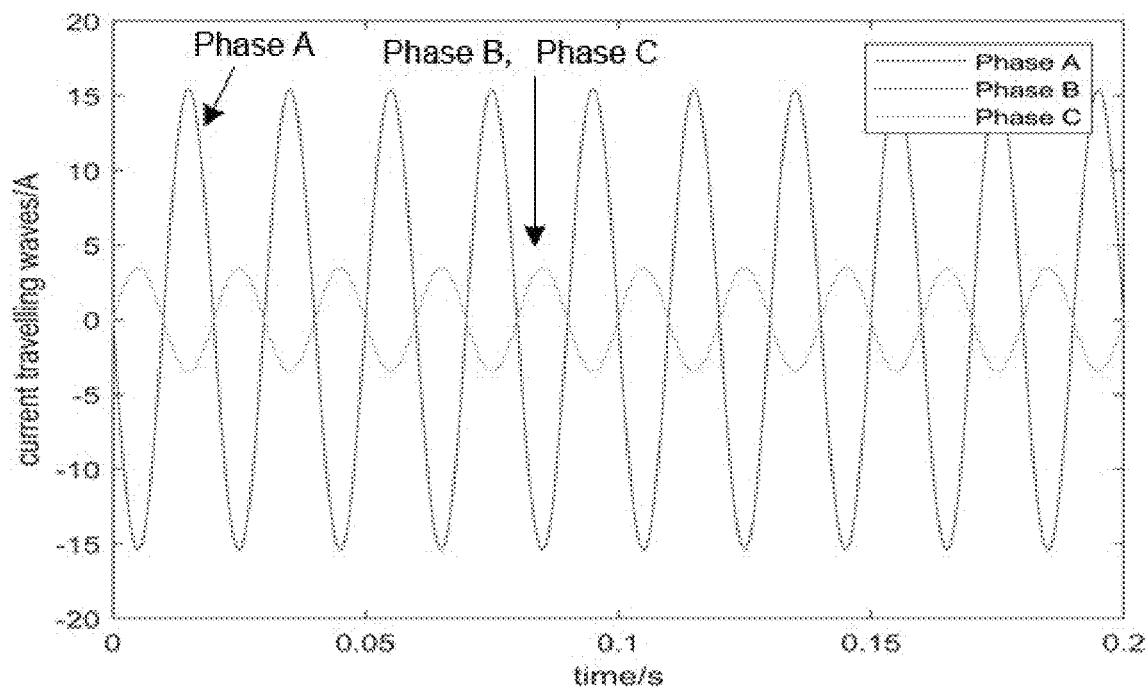
FIG. 7 is a simulation waveform diagram of a fault point on the power source side of the measuring point according to the present invention.
Figure 8:
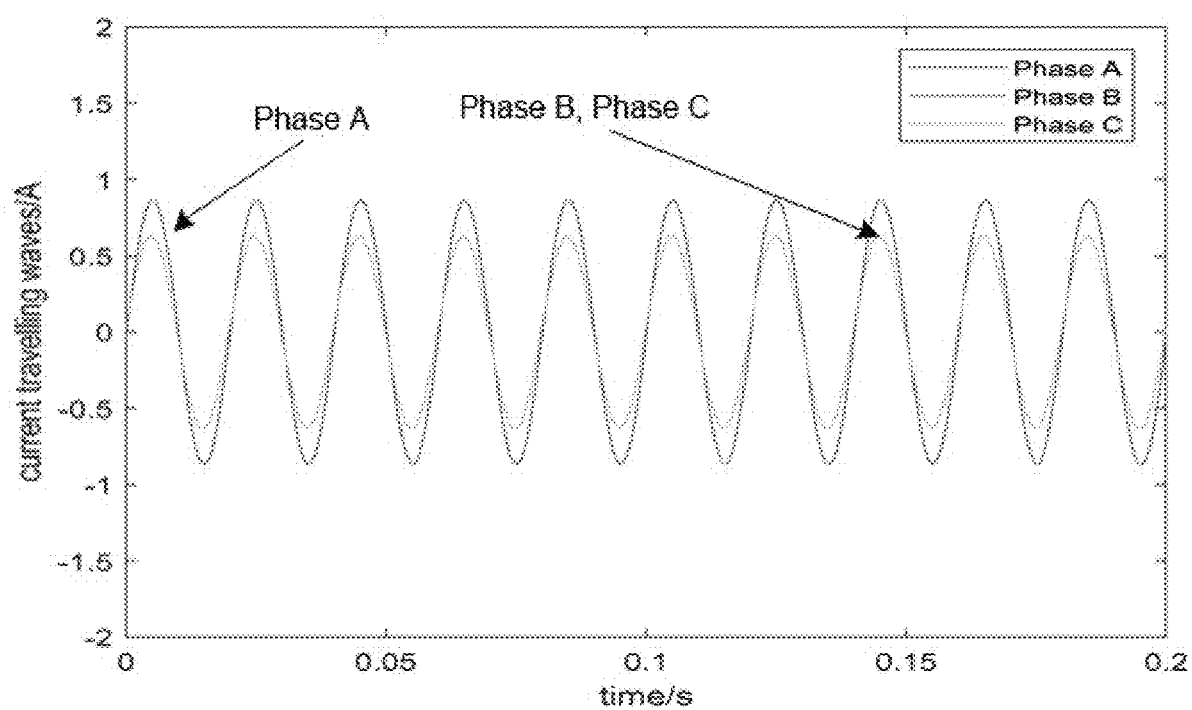
FIG. 8 is a simulation waveform diagram of a non-faulty line of a substation according to the present invention.

Step 108, compare the polarity and amplitude of the three phases current traveling waves difference. When the amplitude of the one phase current traveling wave difference is much larger than the amplitude of the other two phase current traveling waves difference, for example, more than 1.5 times the amplitude of the other two phase currents difference, and the polarity of the phase current traveling wave difference of the largest amplitude is opposite to the polarity of the other two phase current traveling waves difference, it is determined that the fault occurs on the load side of the measuring point of the line, as the simulation waveform shown in FIG. 6. And the phase with the largest amplitude of the current traveling wave difference is the fault phase. If the amplitude of the three phases current traveling wave difference is basically the same and the polarity is the same, it is determined that the fault occurs on the power supply side of the measuring point of the line, as the simulation waveform shown in FIG. 7. FIG. 8 is a simulation waveform diagram of a non-faulty line of a substation according to the present invention.

Figure 4:
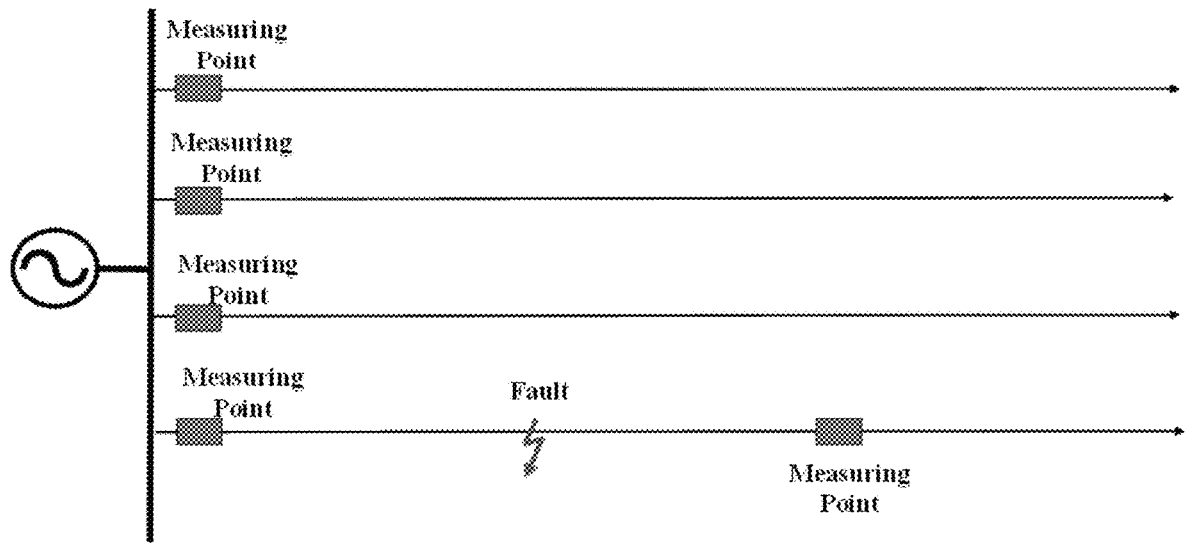
FIG. 4 is a schematic diagram showing the method according to the present invention used in a distribution line.

When the single-phase-to-ground line selection method of the distribution line based on the phase current traveling waves comparison provided by the present invention is applied to one distribution line, as shown in FIG. 4, the measurement points should be distributed at the sectional switch of the line. The measuring point collects the steady-state three phases current traveling waves in the normal running state of the distribution line in real time, and stores the sampling data in a certain period of time. When the traveling wave disturbance is detected, the measuring point no longer collects the transient traveling wave data of the single-phase-to-ground fault of the distribution line. After the two cycles of the fault occurs, the measuring point continues to collect the steady-state three phases current traveling wave after the fault, and stores the steady-state current traveling wave data after the fault for a certain period of time. The steady-state three phases current traveling waves data length should be consistent before and after the fault. Subtract the three phases current traveling waves before the fault from the steady-state three phases current travelling waves after the fault to get the three phases current travelling waves difference. The phase current traveling wave according to the single-phase-to-ground line selection of the distribution line described in this patent is the three phases current traveling waves difference. The amplitude and phase of the phase current traveling waves are obtained by the Fourier decomposition method. The phase difference of 0 degrees is considered to be the same polarity, and the phase difference of 180 degrees is considered to be reverse polarity. Compare the polarity and amplitude of the three phases current traveling waves. When the amplitude of the one phase current traveling wave is much larger than the amplitude of the other two phase current traveling waves, and the polarity of the phase current traveling wave of the largest amplitude is opposite to the polarity of the other two phase current traveling waves, it is determined that the failure occurs on the load side of the measuring point of the line. And the phase with the largest amplitude of the current traveling wave is the fault phase. If the amplitude of the three phases current traveling wave is basically the same and the polarity is the same, it is determined that the fault occurs on the power supply side of the measuring point of the line.

The traveling wave in the embodiment of the present invention refers to a steady-state traveling wave.

The present invention can select the range of the single-phase-to-ground fault point on the distribution line relative to the measuring point. that is the fault point is at the power source side or the load side of the measuring point. When there are multiple measurement points on one line, the identification of the fault section can be further realized.

Figure 2:
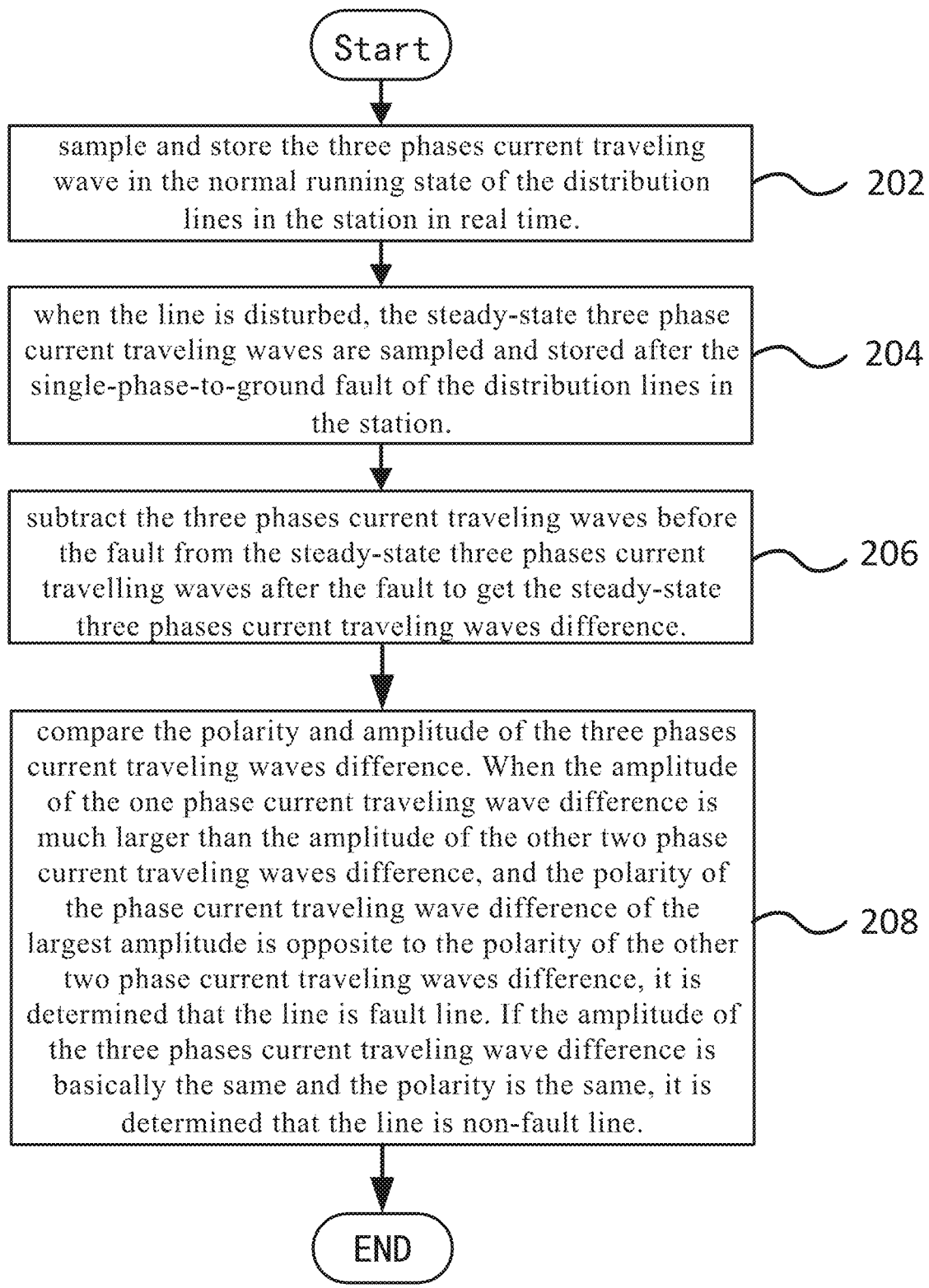
FIG. 2 is a flow chart showing a single-phase-to-ground line selection method for distribution lines in a substation based on phase current traveling wave comparison according to another embodiment of the present invention.
Figure 5:
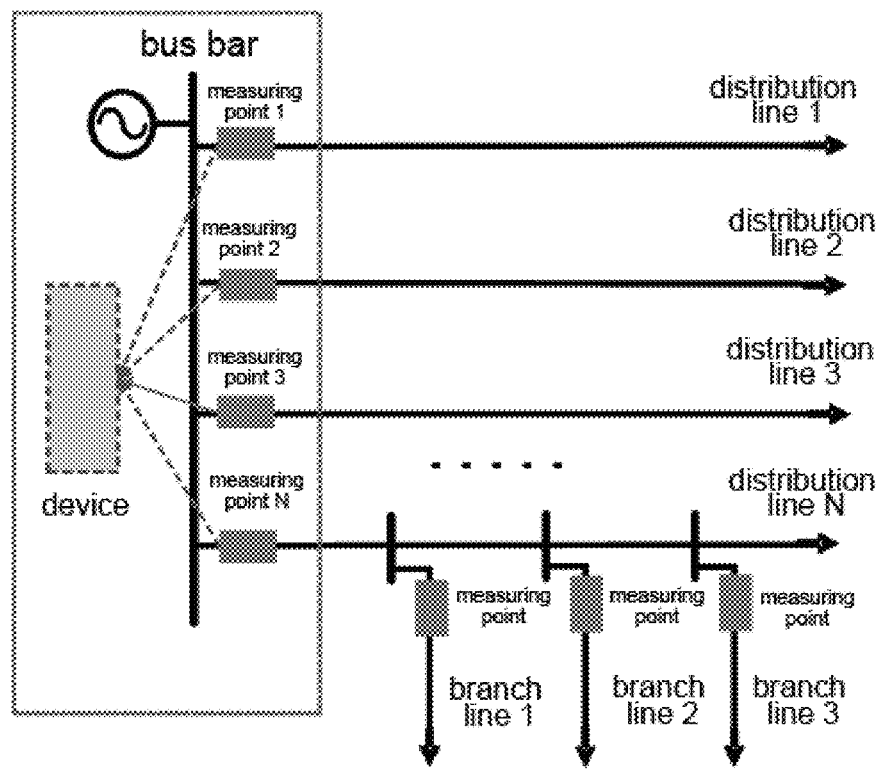
FIG. 5 is a schematic diagram showing the method according to the present invention used in branch lines.

FIG. 2 is a flow chart showing a single-phase-to-ground line selection method for distribution lines 1-N in a substation based on phase current traveling wave comparison according to an embodiment of the present invention, as shown in FIG. 5. Wherein the method includes:

Step 202, sample and store the three phases current traveling wave in the normal running state of the distribution lines in the station in real time.

Step 204, when the line is disturbed, the steady-state three phase current traveling waves are sampled and stored after the single-phase-to-ground fault of the distribution lines in the station.

Step 206, subtract the three phases current traveling waves before the fault from the steady-state three phases current travelling waves after the fault to get the steady-state three phases current traveling waves difference.

Step 208, compare the polarity and amplitude of the three phases current traveling waves difference. When the amplitude of the one phase current traveling wave difference is much larger than the amplitude of the other two phase current traveling waves difference, and the polarity of the phase current traveling wave difference of the largest amplitude is opposite to the polarity of the other two phase current traveling waves difference, it is determined that the line is fault line. If the amplitude of the three phases current traveling wave difference is basically the same and the polarity is the same, it is determined that the line is non-fault line.

The single-phase-to-ground line selection method for the distribution line in the substation based on the phase current traveling waves comparison proposed by the embodiment of the present invention is applied to the distribution line connecting the same bus line in the substation, and the measurement points 1-N are distributed at the head of the line. The measuring point collects the steady-state three phases current traveling waves in the normal running state of the distribution line in real time, and stores the sampling data in a certain period of time. When the traveling wave disturbance is detected, the measuring point no longer collects the transient traveling wave data of the single-phase-to-ground fault of the distribution line. After the two cycles of the fault occurs, the measuring point continues to collect the steady-state three phases current traveling wave after the fault, and stores the steady-state current traveling wave data after the fault for a certain period of time. The steady-state three phases current traveling waves data length should be consistent before and after the fault. Subtract the three phases current traveling waves before the fault from the steady-state three phases current travelling waves after the fault to get the three phases current steady-state traveling waves difference. The phase current traveling wave according to the single-phase-to-ground line selection of the distribution line described in this patent is the three phases current traveling waves difference. The amplitude and phase of the phase current traveling waves difference are obtained by the Fourier decomposition method. The phase difference of 0 degrees is considered to be the same polarity, and the phase difference of 180 degrees is considered to be reverse polarity. Compare the polarity and amplitude of the three phases current traveling wave differences. When the amplitude of the one phase current traveling wave difference is much larger than the amplitude of the other two phase current traveling wave differences, and the polarity of the phase current traveling wave of the largest amplitude is opposite to the polarity of the other two phase current traveling wave differences, it is determined that the line is fault line. If the amplitude of the three phases current traveling wave difference is basically the same and the polarity is the same, it is determined that the line is non-fault line.

The traveling wave in the embodiment of the present invention refers to a steady-state traveling wave.

The present invention can select the fault line from several distribution lines connected by the same busbar of the substation. If multiple measurement points are installed on the fault line, the fault section positioning can be implemented according to the first example.

Figure 3:
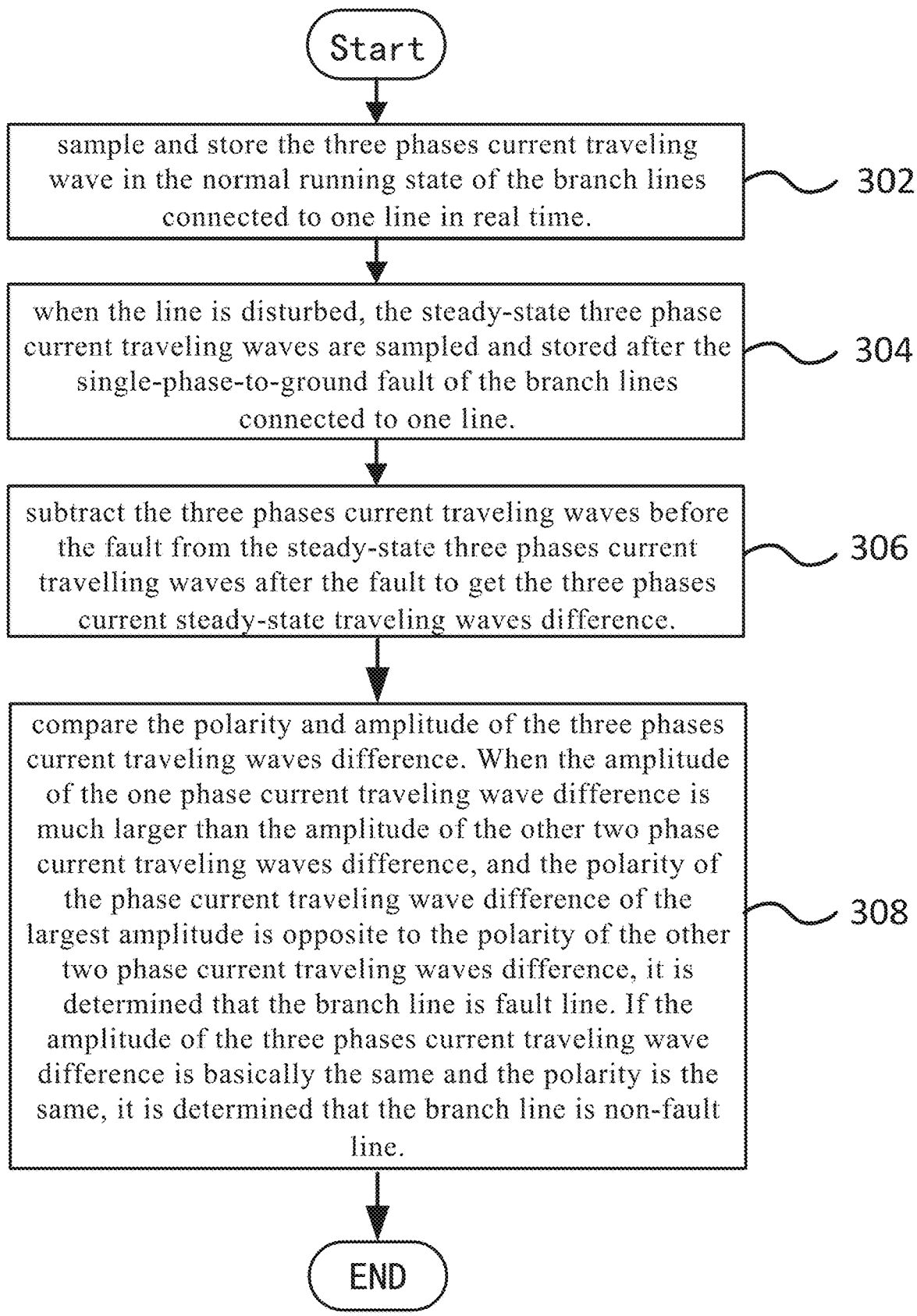
FIG. 3 is a flow chart showing a single-phase-to-ground line selection method for branch lines connected by a distribution line based on phase current traveling waves comparison according to the third embodiment of the present invention.

FIG. 3 is a flow chart showing a single-phase-to-ground line selection method for branch lines 1-3 (as shown in FIG. 5) connected by a distribution line N based on phase current traveling waves comparison according to the third embodiment of the present invention. Wherein the method includes:

Step 302, sample and store the three phases current traveling wave in the normal running state of the branch lines connected to one line in real time.

Step 304, when the line is disturbed, the steady-state three phase current traveling waves are sampled and stored after the single-phase-to-ground fault of the branch lines connected to one line.

Step 306, subtract the three phases current traveling waves before the fault from the steady-state three phases current travelling waves after the fault to get the three phases current steady-state traveling waves difference.

Step 308, compare the polarity and amplitude of the three phases current traveling waves difference. When the amplitude of the one phase current traveling wave difference is much larger than the amplitude of the other two phase current traveling waves difference, and the polarity of the phase current traveling wave difference of the largest amplitude is opposite to the polarity of the other two phase current traveling waves difference, it is determined that the branch line is fault line. If the amplitude of the three phases current traveling wave difference is basically the same and the polarity is the same, it is determined that the branch line is non-fault line.

When the single-phase-to-ground line selection method of the branch line connected to one distribution line based on the phase current traveling waves comparison proposed by the present invention is applied to the branch line connected by one distribution line, the measurement point should be distributed at the head of the branch line, as shown in FIG. 5. The measuring point collects the steady-state three phases current traveling waves in the normal running state of the distribution line in real time, and stores the sampling data in a certain period of time. When the traveling wave disturbance is detected, the measuring point no longer collects the transient traveling wave data of the single-phase-to-ground fault of the distribution line. After the two cycles of the fault occurs, the measuring point continues to collect the steady-state three phases current traveling wave after the fault, and stores the steady-state current traveling wave data after the fault for a certain period of time. The steady-state three phases current traveling waves data length should be consistent before and after the fault. Subtract the three phases current traveling waves before the fault from the steady-state three phases current travelling waves after the fault to get the three phases current steady-state traveling waves difference. The amplitude and phase of the phase current traveling waves are obtained by the Fourier decomposition method. The phase difference of 0 degrees is considered to be the same polarity, and the phase difference of 180 degrees is considered to be reverse polarity. Compare the polarity and amplitude of the three phases current traveling waves difference. When the amplitude of the one phase current traveling wave difference is much larger than the amplitude of the other two phase current traveling waves difference, and the polarity of the phase current traveling wave difference of the largest amplitude is opposite to the polarity of the other two phase current traveling waves difference, it is determined that the branch line is fault line. If the amplitude of the three phases current traveling wave difference is basically the same and the polarity is the same, it is determined that the branch line is non-fault line.

The traveling wave in the embodiment of the present invention refers to a steady-state traveling wave.

The present invention can be applied to the case where several branch lines are connected to one distribution line. Through the measurement point at the head end of the branch line, it can be determined whether the branch line is a fault line. Thereby, fault branch line can be selected by using the measurement points of all the branch line.

For a 50 Hz three-phase AC system, the method according to one embodiment of the present invention comprises:

Step 402, Sample three-phase current traveling waves under normal operation of distribution line real-time at a sampling frequency of 1 kHz. The sampling data of 20 sampling points are stored in the readable storage medium.

Step 404, when the line is disturbed, another 20 sampling points after the fault are sampled continuously and stored.

Step 406, use the following formula to calculate the three phases current waves differences $$\Delta I(j)=I(j)-I(j-N)$$

Where j=1, 2, 20, N=20°

Fast Fourier transform (FFT) is used to get the amplitude and phase of the three phases current waves difference.

Step 408, compare the amplitude of the three phases current waves difference. When the amplitude of one phase current traveling wave difference is much larger than that of the other two phases, for example, it is more than 1.5 times larger than that of the other two phases, it is determined that the fault occurs on the line at the load side of the measuring point; when the amplitude of three-phase current traveling wave difference is basically the same, it is determined that the fault occurs on the line at the power source side of the measuring point.

The present invention also provides a computer-readable storage medium, on which a computer program is stored, which is characterized in that, when the computer program is executed, the step of realizing the method of single-phase ground fault line selection for distribution lines as described in any one of technical solutions described above is realized.

Although embodiments of the present invention have been indicated and described, it can be understood for those ordinary skill in the art that: various changes, modifications, substitutions and variations of these embodiments may be made within the principle and spirit of the present invention, and the scope of the present invention is limited by claims and equivalents thereof.

What is claimed is:

1. A method of single-phase-to-ground fault line selection for a distribution line based on the comparison of phase current traveling waves, the method comprising:
sampling three phases current traveling waves on the distribution line simultaneously at a first measuring point of the distribution line, and taking the pointing direction of the busbar as the current positive direction;
when a single-phase-to-ground fault occurs on the distribution line, comparing the amplitude and polarity of the difference between the three phases current traveling waves before and after the single-phase-to-ground fault,
wherein:
when the amplitude of one of the three phases current traveling waves is higher than 1.5 times of the amplitude of the other two phases current traveling waves, and the polarity of the one of three phases current traveling waves of the largest amplitude is opposite to the polarity of the other two phases current traveling waves, it is determined that the single-phase-to-ground fault occurs on the load side of the first measuring point of the distribution line, and the phase with the largest amplitude of the current traveling wave is the fault phase; and
when the amplitudes of the three phases current traveling waves are substantially the same and the polarities of the three phases current traveling waves are the same, it is determined that the single-phase-to-ground fault occurs on the power source side of the first measuring point of the distribution line,
wherein the comparing the amplitude and polarity of the difference between the three phases current traveling waves before and after the fault comprises:
sampling three phases current traveling waves at the first measuring point in real time under normal operation,
sampling three phases current traveling waves at the first measuring point in real time after the single-phase-to-ground fault occurs,
subtracting the three phases current travelling waves under normal operation from the three phases current travelling waves after the single-phase-to-ground fault occurs, to get three phases current travelling waves difference, and
comparing the amplitude and polarity of three phases current traveling wave difference,
wherein at least a second measuring point is provided at a branch line connected to the distribution line,
wherein the first measuring point is at an out feeding terminal of the distribution line in a substation; and
wherein the second measuring point is at an out feeding terminal of the branch line.

2. The method of single-phase-to-ground fault line selection for a distribution line according to claim 1, further comprising:
sampling and storing the steady-state three phases current traveling waves under normal operation of the distribution line in real time.

3. The method of single-phase-to-ground fault line selection for a distribution line according to claim 1, further comprising:
sampling three phases current traveling waves at the measuring point in real time;
subtracting three phases current travelling waves one power frequency cycle ago from three phases current travelling waves now to get three phases current travelling waves difference, and comparing three phases current travelling waves difference with the setting threshold, if any one phase current traveling wave is higher than the setting threshold, starting the fault line selection.

4. A non-transitory computer-readable storage medium, on which a computer program is stored, wherein when the computer program is executed, the method of single-phase ground fault line selection for a distribution line according to claim 1 is implemented.

5. The method according to claim 1, further comprising:
sampling three phases current traveling waves on the branch line simultaneously at the second measuring point;
when a single-phase-to-ground fault occurs on the branch line, comparing the amplitude and polarity of the difference between the three phases current traveling waves before and after the single-phase-to-ground fault,
wherein:
when the amplitude of one of the three phases current traveling waves is higher than 1.5 times of the amplitude of the other two phases current traveling waves and the polarity of the one of three phases current traveling waves of the largest amplitude is opposite to the polarity of the other two phases current traveling waves, it is determined that the single-phase-to-ground fault occurs on the load side of the second measuring point of the branch line, and the phase with the largest amplitude of the current traveling wave is the fault phase; and
when the amplitudes of the three phases current traveling waves are substantially the same and the polarities of the three phases current traveling waves are the same, it is determined that the single-phase-to-ground fault occurs on the power source side of the second measuring point of the branch line,
wherein the comparing the amplitude and polarity of the difference between the three phases current traveling waves before and after the fault comprises:

sampling three phases current traveling waves at the second measuring point in real time under normal operation,
sampling three phases current traveling waves at the second measuring point in real time after the single-phase-to-ground fault occurs,
subtracting the three phases current travelling waves under normal operation from the three phases current travelling waves after the single-phase-to-ground fault occurs, to get three phases current travelling waves difference, and
comparing the amplitude and polarity of three phases current traveling wave difference.

* * * * *